United States Patent
Huang et al.

(10) Patent No.: US 7,851,282 B2
(45) Date of Patent: Dec. 14, 2010

(54) METHOD FOR FORMING THIN FILM DEVICES FOR FLAT PANEL DISPLAYS

(75) Inventors: Wei-Pang Huang, Hsinchu (TW); Chun-Huai Li, Pingtung (TW); Yun-Sheng Chen, Kaohsiung (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 12/702,477

(22) Filed: Feb. 9, 2010

(65) Prior Publication Data

US 2010/0136730 A1 Jun. 3, 2010

Related U.S. Application Data

(62) Division of application No. 11/760,824, filed on Jun. 11, 2007, now Pat. No. 7,696,029, which is a division of application No. 10/992,278, filed on Nov. 18, 2004, now Pat. No. 7,268,367.

(51) Int. Cl.
*H01L 21/336* (2006.01)

(52) U.S. Cl. ............... 438/163; 257/72; 257/E21.411; 349/43

(58) Field of Classification Search .............. 438/163; 257/72, E21.411; 349/43
See application file for complete search history.

(56) References Cited

U.S. PATENT DOCUMENTS

| | | | |
|---|---|---|---|
| 635,521 A | 10/1899 | Stokes | |
| 5,563,427 A | 10/1996 | Yudasaka et al. | |
| 6,166,397 A * | 12/2000 | Yamazaki et al. | ............. 257/59 |
| 6,278,131 B1 | 8/2001 | Yamazaki et al. | |
| 6,306,693 B1 | 10/2001 | Ishiguro et al. | |
| 6,399,960 B1 | 6/2002 | Yamazaki et al. | |
| 6,573,575 B1 | 6/2003 | Yamazaki | |
| 6,613,620 B2 | 9/2003 | Fujimoto et al. | |
| 6,635,521 B2 * | 10/2003 | Zhang et al. | ................ 438/199 |

(Continued)

FOREIGN PATENT DOCUMENTS

| | | | |
|---|---|---|---|
| JP | 2000077665 A | 3/2000 | |
| JP | 2000315798 A | 11/2000 | |

OTHER PUBLICATIONS

TW Office Action mailed Jul. 4, 2005.
TW Office Action mailed Oct. 4, 2005.
CN Office Action mailed Dec. 1, 2006.
English abstract of JP2000-315798, pub. Nov. 14, 2000.

*Primary Examiner*—Steven J Fulk
(74) *Attorney, Agent, or Firm*—Thomas, Kayden, Horstemeyer & Risley

(57) ABSTRACT

Methods of forming thin film devices with different electrical characteristics on a substrate comprising a driver circuit region and a pixel region. A first and a second polysilicon pattern layers are formed on the driving circuit region and the pixel region of the substrate, respectively. A first ion implantation is performed on the second polysilicon pattern layer using a masking layer covering the first polysilicon pattern layer as an implant mask, such that the first polysilicon pattern layer has an impurity concentration different from the second polysilicon pattern layer. After removal of the masking layer, a gate dielectric layer and a gate are successively formed on each of the first and second polysilicon pattern layers and a source/drain region is subsequently formed in each of the first and second polysilicon pattern layers to define a channel region therein.

5 Claims, 8 Drawing Sheets

U.S. PATENT DOCUMENTS 6,674,136 B1 * 1/2004 Ohtani .................. 257/408
7,037,765 B2 5/2006 Yamazaki et al.
2004/0185607 A1 * 9/2004 Shih et al. ............... 438/151
2004/0191972 A1 9/2004 Hotta
2004/0219723 A1 11/2004 Peng
2004/0253771 A1 12/2004 Yamazaki et al.

* cited by examiner

METHOD FOR FORMING THIN FILM DEVICES FOR FLAT PANEL DISPLAYS

CROSS-REFERENCE TO RELATED APPLICATION

This application is a division of pending U.S. patent application Ser. No. 11/760,824, filed Jun. 11, 2007, which is a divisional application of U.S. patent application Ser. No. 10/992,278, filed Nov. 18, 2004, now U.S. Pat. No. 7,268,367, issued Sep. 11, 2007, and entitled "THIN FILM DEVICES FOR FLAT PANEL DISPLAYS AND METHOD FOR FORMING THE SAME," the contents of which are incorporated herein by reference.

BACKGROUND

The invention relates to flat panel displays and in particular to thin film devices for a flat panel displays, having different electrical characteristics on the driving circuit region and the pixel region.

The demand for active-matrix flat panel displays (FPDs) has increased rapidly in recent years. Currently techniques for forming thin film transistors (TFTs) are needed. In conventional TFT fabrication, an amorphous silicon film formed on a glass substrate is typically used as a channel or active layer of the transistor.

Compared with polysilicon film, amorphous silicon film has a smaller grain size and irregular grain arrangement, reducing the electron mobility and thus lowering the performance of the TFT. Generally, the electron mobility of polysilicon film is 100 times higher than that of amorphous silicon film. In semiconductor fabrication, polysilicon film is typically prepared by low pressure chemical vapor deposition (LPCVD) and then annealed at a temperature above 900° C. The same method cannot be employed in the FPD industry as the strain temperature of glass is about 650° C. Thus, low temperature polysilicon (LTPS) is a novel application for FPD technology. Moreover, LTPS integrates driving circuits on a glass substrate having pixels thereon, reducing the manufacturing cost.

In an active-matrix organic light emitting display (AMOLED), however, the electrical characteristics of the TFTs on the driving circuit region are different from that on the pixel region. For example, in the driving circuit region, the p-type thin film transistor (PTFT) has an absolute threshold voltage value substantially equal to that of an n-type thin film transistor (NTFT). In the pixel region, the threshold voltage of the PTFT serving as an OLED switching element must be lower to reduce power consumption and extend the lifetime thereof. Accordingly, in LTPS technology, it is difficult to form transistors with the desired electrical characteristics on the driving circuit region and the pixel region at the same time.

SUMMARY

Thin film devices for flat panel displays and methods for forming the same are provided. An exemplary embodiment of a thin film device for a flat panel display comprises a substrate comprising a driving circuit region and a pixel region, at least one first thin film transistor, and at least one second thin film transistor. The first thin film transistor is disposed on the driving circuit region of the substrate, which comprises a first gate, a first source/drain region, and a first channel region. The second thin film transistor is disposed on the pixel region of the substrate, which comprises a second gate, a second source/drain region, and a second channel region. The first and second thin film transistors have the same conductivity and the first channel region has an impurity concentration different from the second channel region.

Methods for forming thin film devices for flat panel displays are provided. An exemplary embodiment of a method comprises providing a substrate comprising a driving circuit region and a pixel region. A first polysilicon pattern layer is formed on the driving circuit region of the substrate and simultaneously formed a second polysilicon pattern layer on the pixel region of the substrate. A masking layer is formed over the driving circuit region of the substrate to cover the first polysilicon pattern layer and expose the second polysilicon layer. A first ion implantation is performed on the exposed second polysilicon pattern layer using the masking layer as an implant mask, such that the first polysilicon pattern layer has an impurity concentration different from the second polysilicon pattern layer. The masking layer is removed. A gate dielectric layer and an overlying gate are formed on the first and second polysilicon pattern layers, respectively. A second ion implantation is performed on the first and second polysilicon pattern layers using each gate as an implant mask, to respectively form a source/drain region therein and respectively define a channel region.

In some embodiments of a method for forming a thin film device for a flat panel display, a substrate comprising a driving circuit region and a pixel region is provided. A first polysilicon pattern layer is formed on the driving circuit region of the substrate and simultaneously formed a second polysilicon pattern layer on the pixel region of the substrate. Ion implantation with a first conductivity type is performed on the first and second polysilicon pattern layers. A masking layer is formed over the pixel region of the substrate to cover the second polysilicon pattern layer and expose the first polysilicon layer. Ion implantation with a second conductivity type opposite to the first conductivity type is performed on the exposed first polysilicon pattern layer, using the masking layer as an implant mask, such that the first polysilicon pattern layer has an impurity concentration different from the second polysilicon pattern layer. The masking layer is removed. A gate dielectric layer and an overlying gate are formed on the first and second polysilicon pattern layers, respectively. Ion implantation is performed on the first and second polysilicon pattern layers using each gate as an implant mask, to respectively form a source/drain region therein and respectively define a channel region.

DESCRIPTION OF THE DRAWINGS

Thin film devices for flat panel displays and methods for forming the same will become more fully understood from the detailed description given hereinbelow and the accompanying drawings, given by way of illustration only and thus not intended to be limitative of the invention.

DETAILED DESCRIPTION

In a flat panel display formed by low temperature polysilicon (LTPS) technology, for example, an active-matrix organic light emitting display (AMOLED), the driving circuits may be integrated on a glass substrate to reduce manufacturing cost. As previously described, however, the electrical characteristic of the thin film transistors (TFTs) on the driving circuit region is different from that on the pixel region. In order to meet the demand of the electrical characteristics for each region, channel regions with different impurity concentrations may be formed after completing the fabrication of the TFTs, such that the threshold voltage of the TFTs on the driving circuit region is different from that on the pixel region. That is, as TFTs are fabricated using LTPS technology, TFTs with desired electrical characteristics on the driving circuit region and the pixel region, respectively, may be simultaneously formed.

Figure 1A:
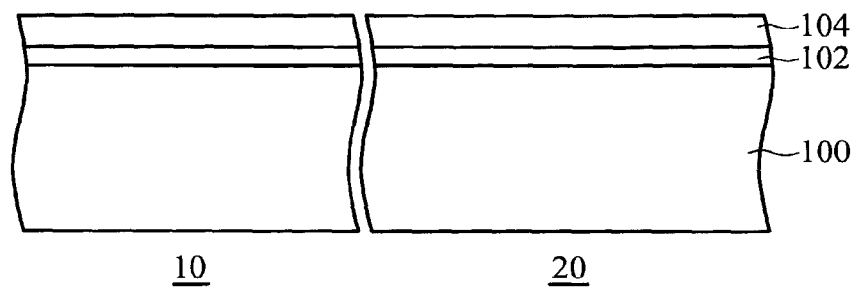
FIGS. 1A to 1F are cross-sections of an embodiment of a method for forming a thin film device for a flat panel display.

Thin film devices for flat panel displays and methods for forming the same will be described in greater detail in the following. FIGS. 1A to 1F are cross-sections of an embodiment of a method for forming thin film devices for flat panel displays. As shown in FIG. 1A, a substrate 100 comprising a driving circuit region 10 and a pixel region 20 is provided. The substrate 100 may comprise glass, quartz, or plastic. An amorphous silicon layer 104 is formed on the substrate 100. The amorphous silicon layer 104 serves as a channel or active layer for a TFT, which is prepared by chemical vapor deposition (CVD) or other conventional deposition and has a thickness of about 300 to 1000 Å. In order to increase adhesion between the amorphous silicon layer 104 and the substrate 100, a buffer layer 102 may be formed therebetween. For example, the buffer layer 102 may comprise a single layer such as a silicon oxide layer or multiple layers such as a silicon nitride layer and an overlying silicon oxide layer.

Figure 1B:
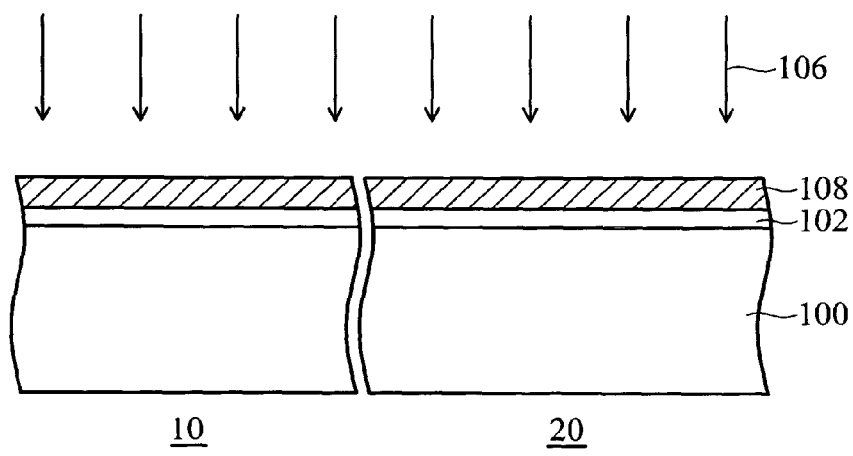

As shown in FIG. 1B, crystallization 106 is performed on the amorphous silicon layer 104 on the substrate 100, such that the amorphous silicon layer 104 is transformed into a polysilicon layer 108. The crystallization 106 may comprise a laser annealing treatment which employs, for example, an excimer laser, continuous wave laser, or laser beam pulse. Since the temperature of the crystallization 106 is below 600° C., this method is suitable for transparent glass substrates.

Figure 1C:
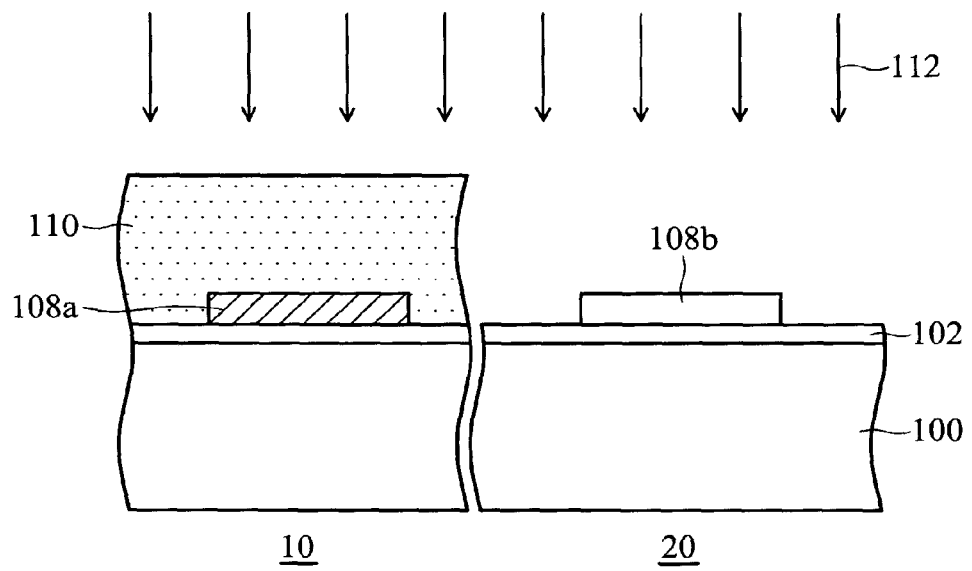

As shown in FIG. 1C, the polysilicon layer 108 is patterned by conventional lithography and etching to form at least one first polysilicon pattern layer 108a on the driving circuit region 10 of the substrate 100 and simultaneously form at least one second polysilicon pattern layer 108b on the pixel region 20. A masking layer 110, such as photoresist, is then formed over the driving circuit region 10 of the substrate 100 to cover the first polysilicon pattern layer 108a and expose the second polysilicon pattern layer 108b on the pixel region 20. A first ion implantation (channel doping) 112 is performed on the exposed second polysilicon pattern layer 108b using the masking layer 110 as an implant mask. The element for ion implantation 112 is based on the conductivity type of the subsequent TFT. For example, if NTFT is desired, the element for ion implantation 112 may comprise phosphorus or arsenic. Conversely, if PTFT is desired, the element for ion implantation 112 may comprise boron. Here, PTFT gives as an example. The first polysilicon pattern layer 108a has an impurity concentration different from the second polysilicon pattern layer 108b subsequent to the first ion implantation 112. The impurity concentration of the first polysilicon pattern layer 108a is lower than that of the second polysilicon pattern layer 108b because the former is covered by the masking layer 110 during the first ion implantation 112.

Figure 1D:
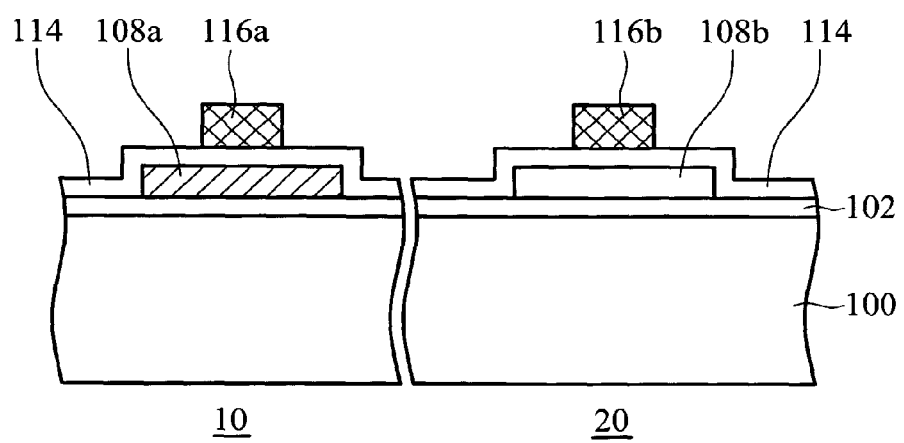

As shown in FIG. 1D, the masking layer 110 is removed. Thereafter, a dielectric layer 114, such as silicon oxide or silicon nitride, which serves as a gate dielectric, is formed overlying the substrate 100 to cover the first and second polysilicon pattern layers 108a and 108b. A conductive layer (not shown), such as doped polysilicon or metal, is formed on the dielectric layer 114. The conductive layer is subsequently patterned by conventional lithography and etching, to form gates 116a and 116b over the first and second polysilicon pattern layer 108a and 108b, respectively.

Figure 1E:
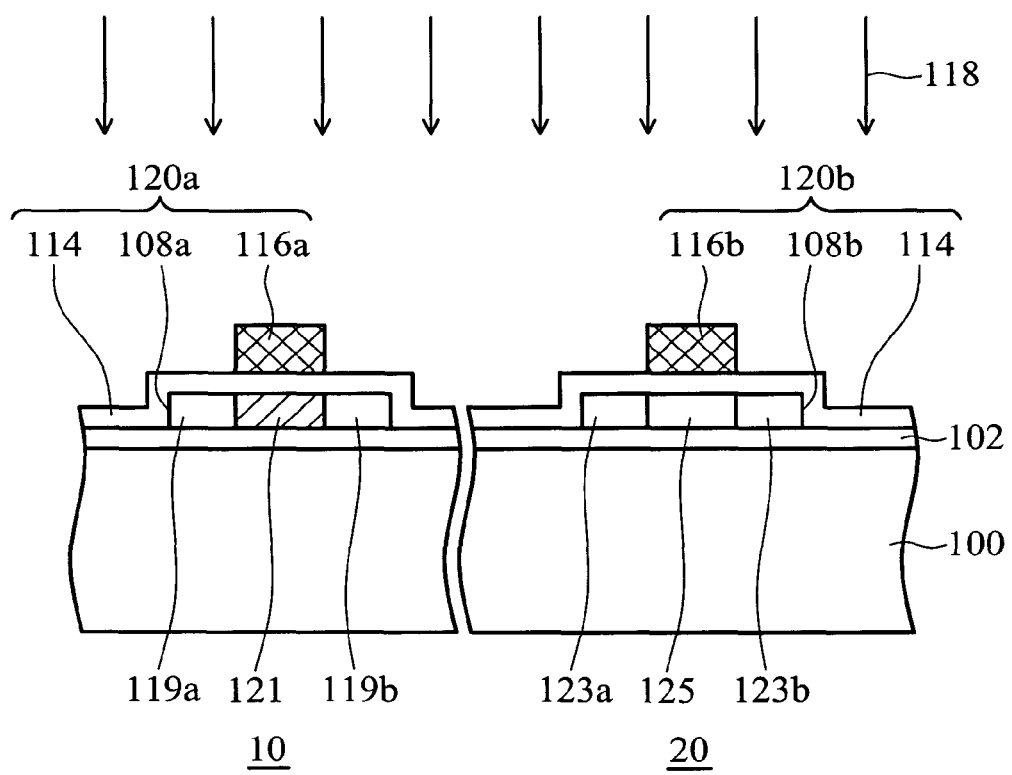

As shown in FIG. 1E, a second ion implantation (source/drain doping) 118 is performed on the first and second polysilicon pattern layers 108a and 108b using the gates 116a and 116b as implant masks, thereby forming source and drain regions 119a and 119b in the first polysilicon pattern layer 108a and defining a channel region 121 therebetween. At the same time, source and drain regions 123a and 123b are also formed in the second polysilicon pattern layer 108b and defining a channel region 125 therebetween. As a result, the TFTs 120a and 120b with the same conductivity type (p-type) are respectively formed on the driving circuit region 10 and the pixel region 20. Note that the channel regions 121 and 125 on the driving circuit region 10 and the pixel region 20 have different impurity concentrations due to the first ion implantation 112, as shown in FIG. 1C. The threshold voltage of the PTFT 120b on the pixel region 20 may be reduced due to the first ion implantation 112. Accordingly, as such TFT is used as a switching element for AMOLED, it may reduce power consumption and potentially extend the lifetime of the organic light emitting diode. Moreover, the TFTs on the driving circuit region 10 are not affected by the first ion implantation 112, such that the absolute value of the threshold of the PTFT 120a on the driving circuit region 10 is substantially equal to that of the NTFT (not shown) thereon.

Figure 1F:
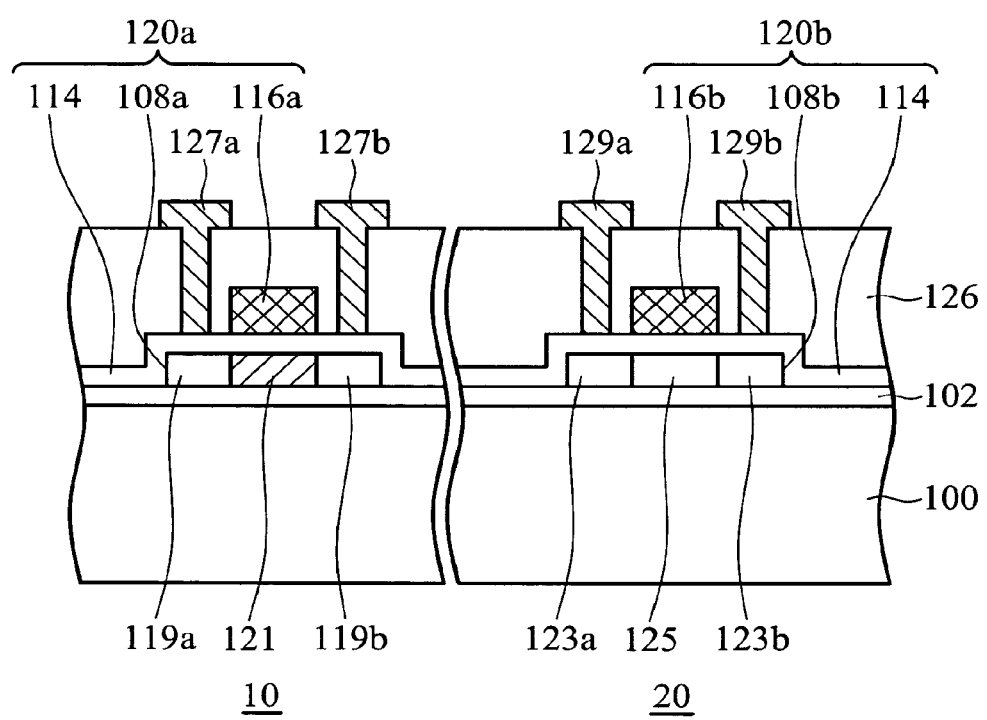

As shown in FIG. 1F, an interlayer dielectric (ILD) layer 126 covers the dielectric layer 114 and the gates 116a and 116b. Next, the ILD layer 126 are patterned by lithography and etching, to form holes therein and expose source regions 119a and 123a and drain regions 119b and 123b. A conductive layer (not shown), such as tungsten, is formed on the ILD layer 126 and fills the holes. Next, the conductive layer is patterned by conventional lithography and etching to form interconnects 127a and 127b on the source and drain regions 119a and 119b on the driving circuit region 10 and simultaneously form interconnects 129a and 129b on the source and drain regions 123a and 123b on the pixel region 20, thereby completing the fabrication of thin film device with different electrical characteristics on the driving circuit region and pixel region.

Figure 2A:
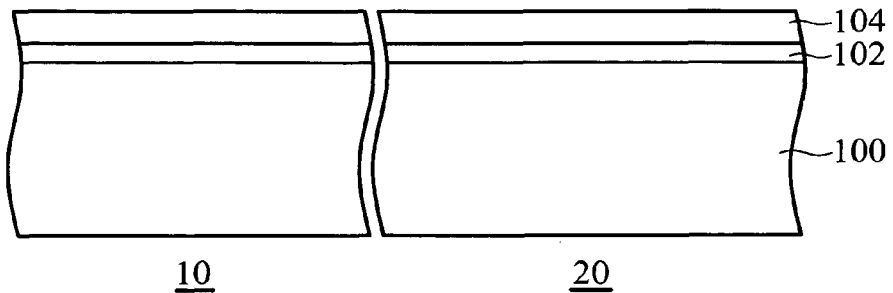
FIGS. 2A to 2G are cross-sections of an embodiment of a method for forming a thin film device for a flat panel display.

FIGS. 2A to 2G are cross-sections of an embodiment of a method for forming a thin film device for a flat panel display, wherein the same reference numbers are used in the drawings. As shown in FIG. 2A, a substrate 100 comprising a driving circuit region 10 and a pixel region 20 is provided. The substrate 100 may comprise glass, quartz, or plastic. An amorphous silicon layer 104 is formed on the substrate 100. The amorphous silicon layer 104 serves as a channel or active layer for a TFT, which is prepared by CVD or other conventional deposition and has a thickness of about 300 to 1000 Å. In order to increase adhesion between the amorphous silicon layer 104 and the substrate 100, a buffer layer 102 may be formed therebetween. For example, the buffer layer 102 may comprise a single layer such as a silicon oxide layer or multiple layers such as a silicon nitride layer and an overlying silicon oxide layer.

Figure 2B:
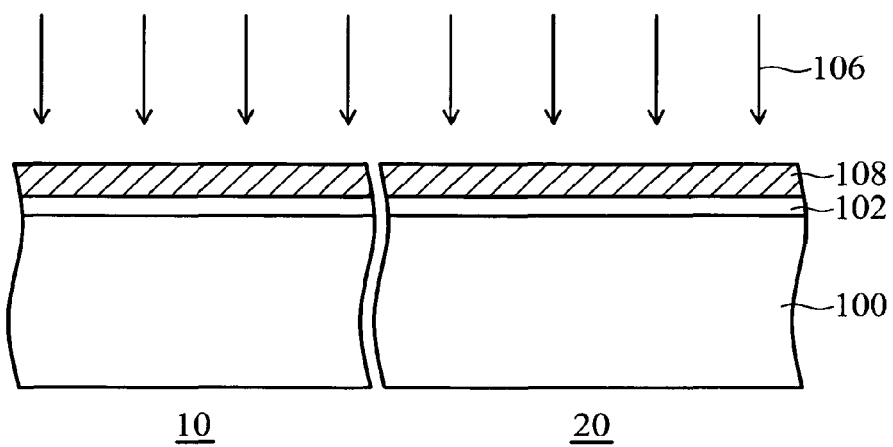

As shown in FIG. 2B, crystallization 106 is performed on the amorphous silicon layer 104 on the substrate 100, such that the amorphous silicon layer 104 is transformed into a polysilicon layer 108. The crystallization 106 may comprise a laser annealing treatment which employs, for example, an excimer laser, continuous wave laser, or laser beam pulse.

Figure 2C:
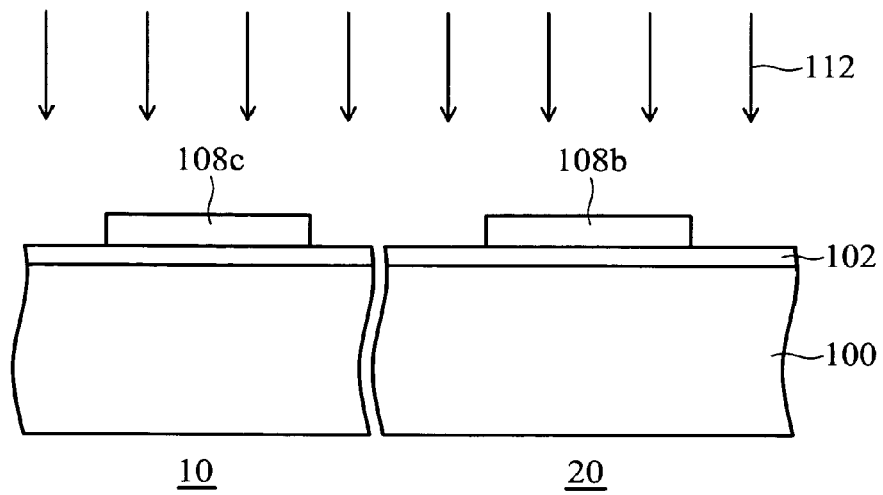

As shown in FIG. 2C, the polysilicon layer 108 is patterned by conventional lithography and etching to form at least one first polysilicon pattern layer 108a on the driving circuit region 10 of the substrate 100 and simultaneously form at least one second polysilicon pattern layer 108b on the pixel region 20.

Ion implantation (channel doping) 112 with a first conductivity type (a critical step of this embodiment) is then performed on the first and second polysilicon pattern layers 108c and 108b. The element for ion implantation 112 is based on the conductivity type of the subsequent TFT. For example, if NTFT is desired, the element for ion implantation 112 may comprise phosphorus or arsenic. Conversely, if PTFT is desired, the element for ion implantation 112 may comprise boron. Here, PTFT gives as an example. Thereafter, a masking layer 110, such as a photoresist layer, is formed over the pixel region 20 of the substrate 100 to cover the second polysilicon pattern layer 108b and expose the first polysilicon pattern layer 108c on the driving circuit region 10. An ion implantation 113 with a second conductivity type opposite to the first conductivity type is performed on the exposed first polysilicon pattern layer 108c using the masking layer 110 as an implant mask. The first polysilicon pattern layer comprises p-type and n-type impurities therein marked "108d" in FIG. 2D.

In some embodiments, the ion implantation 112 with a first conductivity type may be a boron (p-type) ion implantation and the ion implantation 113 with a second conductivity type may be a phosphorus or arsenic (n-type) ion implantation. The first polysilicon pattern layer 108d has an impurity concentration different from the second polysilicon pattern layer 108b after performing the ion implantation 113. The impurity concentration of the first polysilicon pattern layer 108d is higher than that of the second polysilicon pattern layer 108b since the latter is covered by the masking layer 110 during the first ion implantation 113.

Figure 2D:
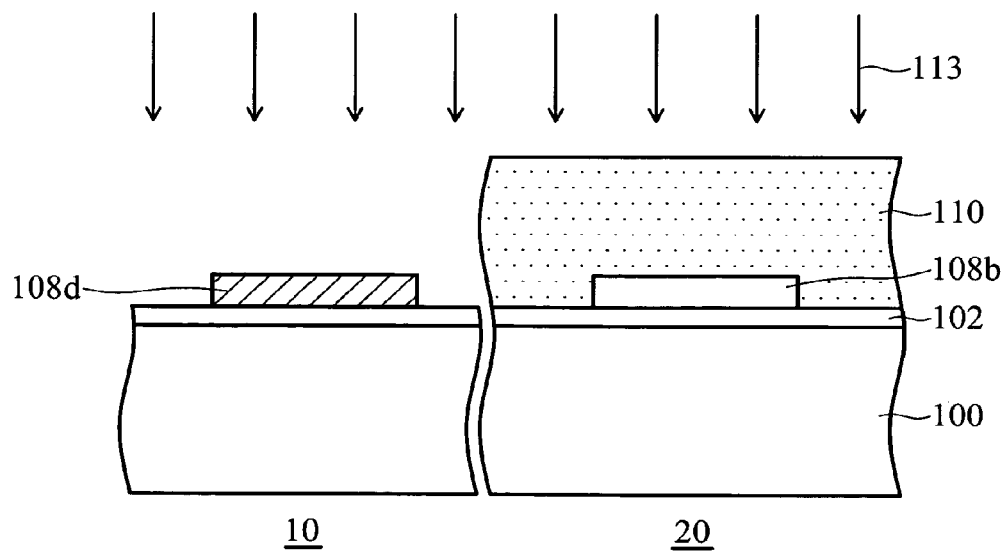
Figure 2E:
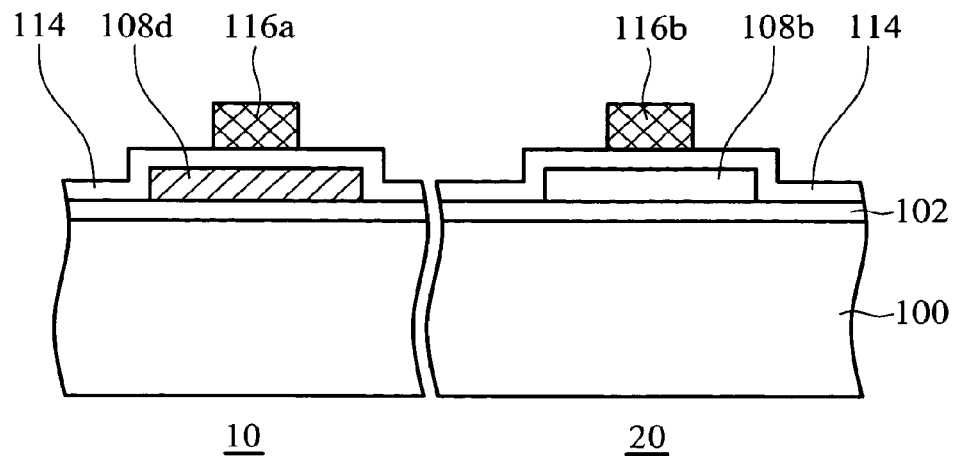

As shown in FIG. 2E, the masking layer 110 is removed. Thereafter, a dielectric layer 114, such as silicon oxide or silicon nitride, which serves as a gate dielectric, is formed overlying the substrate 100 to cover the first and second polysilicon pattern layers 108d and 108b. A conductive layer (not shown), such as doped polysilicon or metal, is formed on the dielectric layer 114. The conductive layer is subsequently patterned by conventional lithography and etching, to form gates 116a and 116b over the first and second polysilicon pattern layer 108d and 108b, respectively.

Figure 2F:
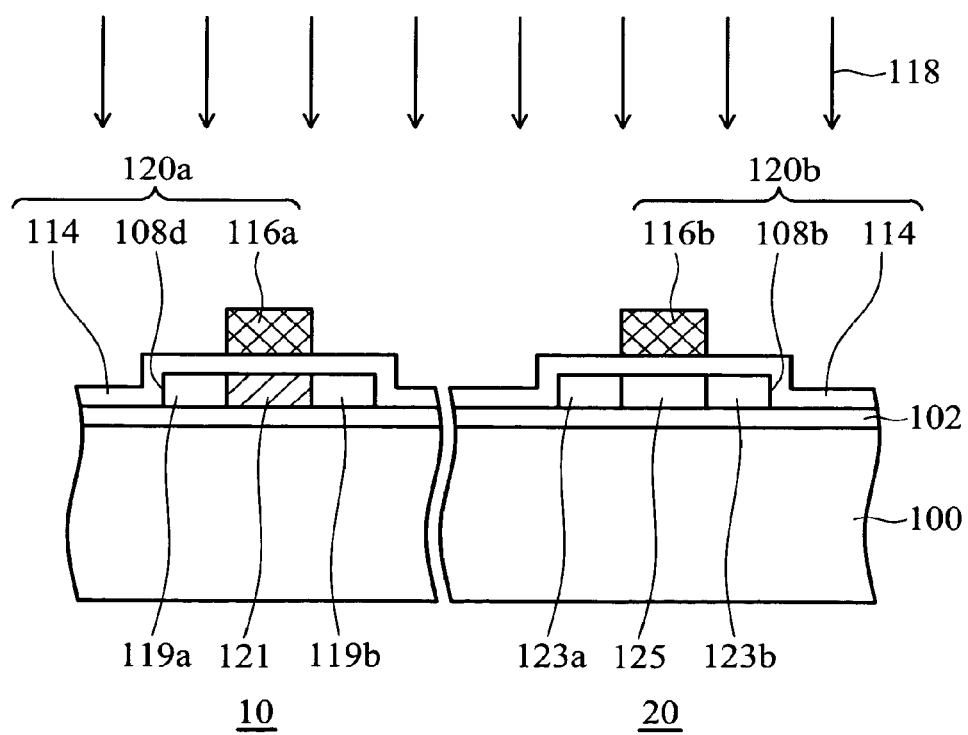

As shown in FIG. 2F, an ion implantation (source/drain doping) 118 is performed on the first and second polysilicon pattern layers 108d and 108b using the gates 116a and 116b as implant masks, thereby forming source and drain regions 119a and 119b in the first polysilicon pattern layer 108d and defining a channel region 121 therebetween. At the same time, source and drain regions 123a and 123b are also formed in the second polysilicon pattern layer 108b and defining a channel region 125 therebetween. As a result, the TFTs 120a and 120b with the same conductivity type (p-type) are respectively formed on the driving circuit region 10 and the pixel region 20. Note that the channel regions 121 and 125 on the driving circuit region 10 and the pixel region 20 have different impurity concentrations due to the ion implantations 112 and 113, as shown in FIGS. 2C and 2D. The threshold voltage of the PTFT 120b on the pixel region 20 may be reduced due to the ion implantation 112. Accordingly, use of TFTs for AMOLED switching elements may reduce power consumption and potentially extend the lifetime of the organic light emitting diode. Moreover, since the channel regions of TFTs on the driving circuit region 10 comprise p-type and n-type impurities, such that the absolute value of the threshold of the PTFT 120a on the driving circuit region 10 is substantially equal to that of the NTFT (not shown) thereon.

Figure 2G:
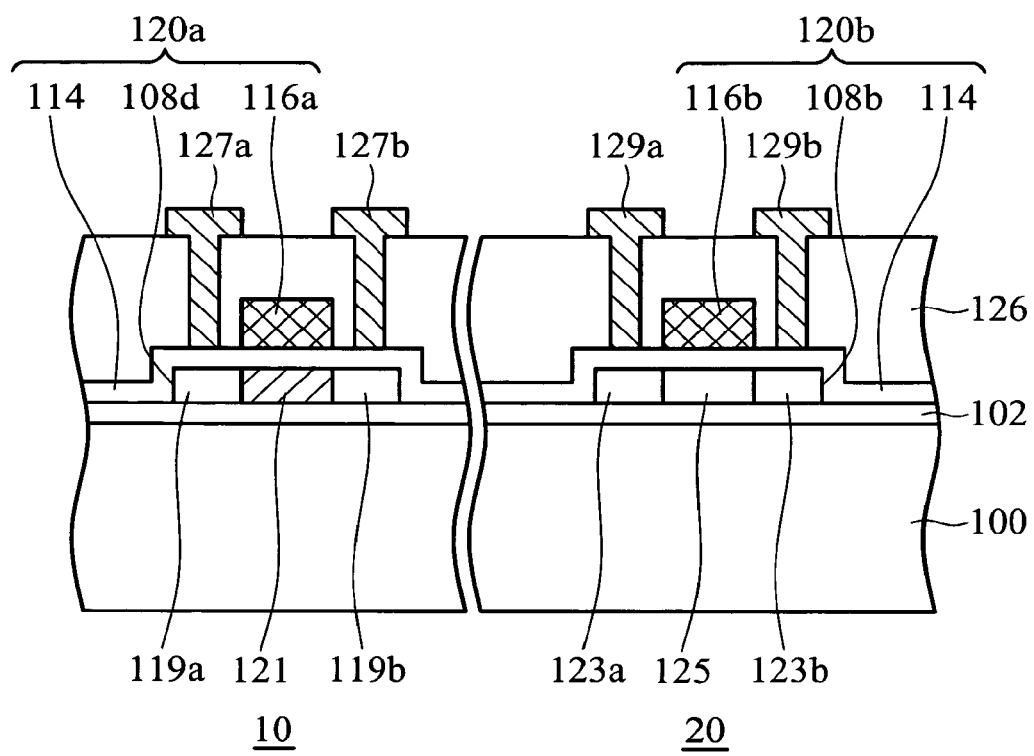

As shown in FIG. 2G, an interlayer dielectric (ILD) layer 126 covers the dielectric layer 114 and the gates 116a and 116b. Next, the ILD layer 126 are patterned by lithography and etching, to form holes therein and expose source regions 119a and 123a and drain regions 119b and 123b. A conductive layer (not shown), such as tungsten, is formed on the ILD layer 126 and fills the holes. Next, the conductive layer is patterned by conventional lithography and etching to form interconnects 127a and 127b on the source and drain regions 119a and 119b on the driving circuit region 10 and simultaneously form interconnects 129a and 129b on the source and drain regions 123a and 123b on the pixel region 20, thereby completing the fabrication of a thin film device with different electrical characteristics on the driving circuit region and pixel region.

Referring to FIG. 1F or 2G, a cross-section of an embodiment of a thin film device for a flat panel display is shown. An embodiment of the thin film device comprises a substrate 100 comprising a driving circuit region 10 and a pixel region 20, thin film transistors 120a and 120b, an ILD layer 126, and interconnects 127a, 127b, 129a, and 129b. The thin film transistor 120a is disposed on the driving circuit region 10 of the substrate 100, comprising a gate 116a and a first polysilicon pattern layer 108a or 108d comprising a source region 119a, a drain region 119b, and a channel region 121. The thin film transistor 120b is disposed on the pixel region 20 of the substrate 100, comprising a gate 116b and a second polysilicon pattern layer 108b comprising a source region 123a, a drain region 123b, and a channel region 125. The ILD layer 126 covers the thin film transistors 120a and 120b, comprising holes to expose the source regions 119a and 123a and drain regions 119b and 123b. Interconnects 127a and 127b are disposed in the holes over the source and drain regions 119a and 119b for electrical connection thereof. Interconnects 129a and 129b are disposed in the holes over the source and drain regions 123a and 123b for electrical connection thereof.

Thin film transistor 120a has the same conductivity type as the thin film transistor 120b. For example, the thin film transistors 120a and 120b may be a p-type or n-type thin film transistor. Moreover, the channel region 121 of the thin film transistor 120a has an impurity concentration different from that of the channel region 125 of the thin film transistor 120b. In some embodiments, the impurity concentration of the channel region 121 may be lower than that of the channel region 125, as shown in FIG. 1F. Additionally, in some embodiments, the impurity concentration of the channel region 121 may be higher than that of the channel region 125, as shown in FIG. 2G.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation to encompass all such modifications and similar arrangements.

What is claimed is:

1. A method for forming a thin film device for a flat panel display, comprising:

providing a substrate comprising a driving circuit region and a pixel region;

forming a first polysilicon pattern layer on the driving circuit region of the substrate and simultaneously forming a second polysilicon pattern layer on the pixel region of the substrate;

ion implantation of the first and second polysilicon pattern layers with a first conductivity type;

forming a masking layer over the pixel region of the substrate to cover the second polysilicon pattern layer and expose the first polysilicon pattern layer;

ion implantation of the exposed first polysilicon pattern layer with a second conductivity type opposite to the first conductivity type, using the masking layer as an implant mask, such that the first polysilicon pattern layer has an impurity concentration different from the second polysilicon pattern layer;

removing the masking layer;

forming a gate dielectric layer and an overlying gate on the first and second polysilicon pattern layers, respectively; and ion implantation of the first and second polysilicon pattern layers using each gate as an implant mask, to respectively form a source/drain region therein and respectively define a channel region.

2. The method as claimed in claim 1, further comprising:

covering each gate with an interlayer dielectric layer having holes to expose each source/drain region; and filling each hole with a conductive layer serving as an interconnect.

3. The method as claimed in claim 1, wherein the first and second polysilicon pattern layers are formed by annealing amorphous pattern layers using an excimer laser.

4. The method as claimed in claim 1, wherein the first conductivity type is n-type.

5. The method as claimed in claim 1, wherein the first conductivity type is p-type.

* * * * *